(12) United States Patent
Skendzic et al.

(10) Patent No.: US 7,474,192 B2
(45) Date of Patent: Jan. 6, 2009

(54) PRECISION ROGOWSKI COIL AND METHOD FOR MANUFACTURING SAME

(75) Inventors: Veselin Skendzic, Pullman, WA (US); James R. Kesler, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 11/757,635

(22) Filed: Jun. 4, 2007

(65) Prior Publication Data
US 2007/0226989 A1 Oct. 4, 2007

Related U.S. Application Data

(62) Division of application No. 11/051,232, filed on Feb. 4, 2005, now Pat. No. 7,227,441.

(51) Int. Cl.
*H01F 5/00* (2006.01)
*H01F 27/28* (2006.01)
(52) U.S. Cl. .................... 336/225; 336/229; 336/200; 336/232
(58) Field of Classification Search ............. 336/200, 336/229, 232, 225, 208, 223
See application file for complete search history.

(56) References Cited

U.S. PATENT DOCUMENTS 5,831,506 A * 11/1998 Crepel ................... 336/187
6,137,394 A * 10/2000 Holmes et al. ........... 336/208
2005/0156703 A1 * 7/2005 Twaalfhoven ............ 336/229

FOREIGN PATENT DOCUMENTS

| JP | 2001102230 A | * | 4/2001 |
| JP | 2003173922 A | * | 6/2003 |
| JP | 2004228296 A | * | 8/2004 |

* cited by examiner

*Primary Examiner*—Anh T Mai
(74) *Attorney, Agent, or Firm*—Eugene M. Cummings, P.C.

(57) ABSTRACT

An improved Rogowski coil is formed on a toroidal core made of a thermoplastic or other moldable material, the core having a preferably continuous groove or grooves extending around the core. The grooves correspond in size to magnet wire which registers within the grooves, thus controlling the specific location of the wires. The grooving may be helical. A return loop can be provided for return path cancellation, or a reverse winding can be added in a direction opposite to the direction of advancement of the main coil. In using the return loop, a resistive network can be added to improve the cancellation of the return path due to the effect of geometries. In addition, it can compensate for thermal and other variations.

6 Claims, 4 Drawing Sheets

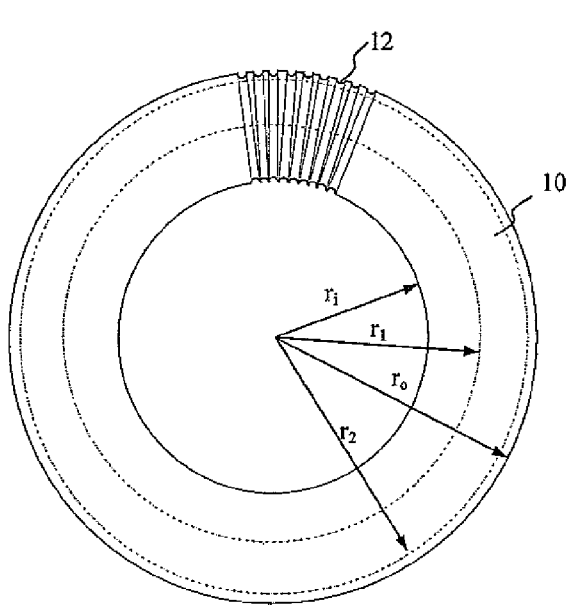
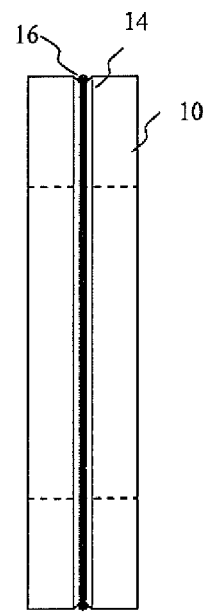
Figure 1A
Figure 1B
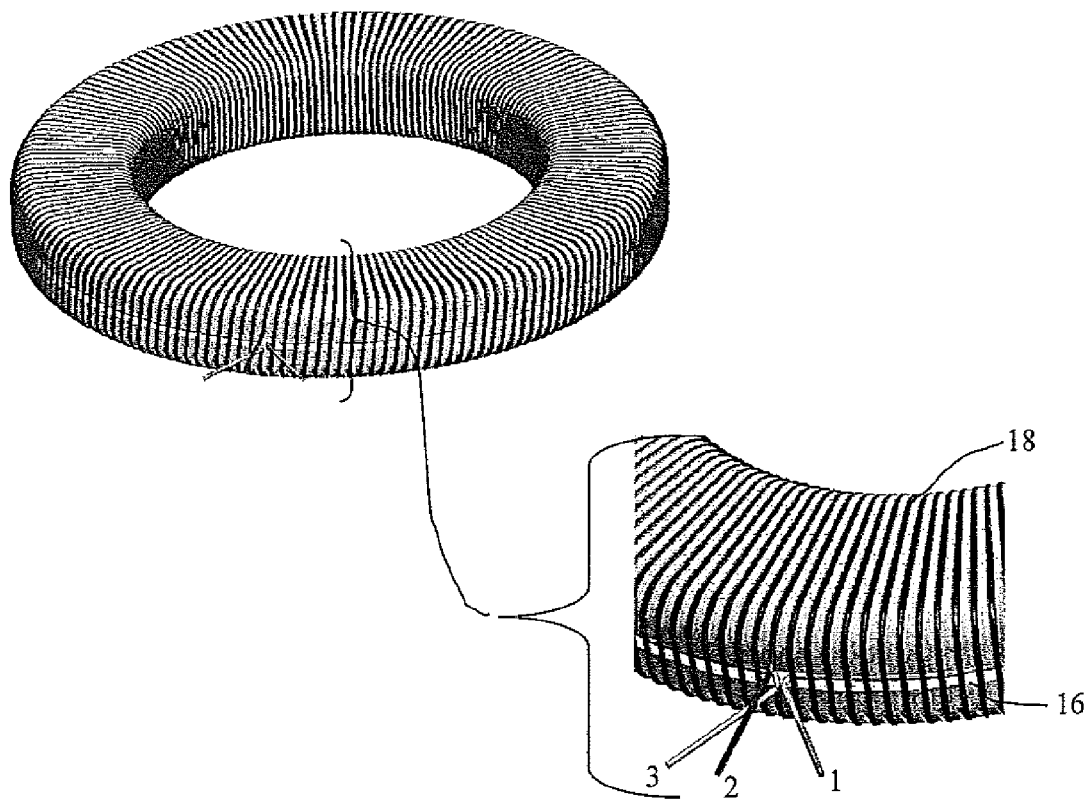
Figure 2 A

PRECISION ROGOWSKI COIL AND METHOD FOR MANUFACTURING SAME

CROSS-REFERENCE TO RELATED APPLICATION

This application is a Divisional application of U.S. patent application Ser. No. 11/051,232 filed on Feb. 4, 2005 now U.S. Pat. No. 7,227,441, and entitled "Precision Rogowski Coil and Method for Manufacturing Same", naming Veselin Skendzic and James R. Kesler as inventors.

BACKGROUND OF THE INVENTION

The present invention concerns Rogowski coils. More particularly, the present invention concerns the structure and manner of making a Rogowski coil.

Rogowski coils are well known electrical devices finding use today for measurement of magnetic fields and electrical currents. They have been researched over the past century and are well known to the scientific literature. Their origin traces to the invention circa 1912 of the Rogowski coil by W. Rogowski and W. Steinhousen. The device is useful for measuring electrical currents and operates on the basis of a magnetic field integration performed across a closed contour being equal to the current flowing through the contour. The coil provides a voltage output proportional to the time derivative of the current (di/dt) rather than a current output like other current transformers.

Rogowski coils are popular because of their dynamic range and linearity. However, though theoretical requirements are known, manufacturers still need ways to provide a high quality coil that is both economical to manufacture and which is satisfactory for precise current measurements. The device (coil) should be insensitive to external influences, insensitive to the measured primary conductor position, and retain high precision (in the order of 0.3% or better) over its lifetime and across a wide temperature range (nominally −40 to 70 degrees Centigrade).

One known approach to making a Rogowski coil involves using a printed circuit. U.S. Pat. No. 5,414,400 entitled "Rogowski Coil" discloses a Rogowski coil made on a printed circuit plate provided with a circular cut-out. The coil is implemented by metal deposits on each of the two faces of the plate extending along radii, with electrical connections between the radii on one face and those on the opposite face being achieved via plated-through holes passing through the thickness of the plate.

U.S. Pat. No. 5,442,280 discloses a method for manufacturing a printed circuit board-based Rogowski coil. The disclosed geometry provides very high turn density resulting in very high sensitivity. While high sensitivity is very desirable when measuring low frequency currents (50/60 Hz power system related), the patent fails to provide adequate means for external field cancellation. This problem is reported in U.S. Pat. No. 6,624,624 and is caused by inadequate handling of the coil return path.

A similar problem applies to the design reported in U.S. Pat. No. 6,313,623 (by the current inventor) in which two closely spaced coils with counter rotation are used to perform partial return path compensation.

Further attempts to design precision Rogowski coils are disclosed in U.S. Pat. No. 6,624,624. Attempts to provide improved return path cancellation resulted in significantly reduced coil densities, making the design less appropriate for low frequency current measurement applications. In addition, although significantly improved, all reported geometries suffer from Z-axis (board thickness) related sensitivity contour effects with an error cancellation (return) path normally offset in the direction of the Z-axis (board thickness).

J. D. Ramboz in "Machinable Rogowski Coil, Design and Calibration," *IEEE Transactions on Instrumentation and Measurement,* Vol. 45, No. 2, (April 1996) pp 511-15 reviews traditional designs for Rogowski coils and discusses a "machinable" Rogowski coil constructed using machinable ceramic material to make a toroidal coil with a rectangular cross section. A thin, electrically conductive coating is then applied to the coil, totally encapsulating the ceramic core. Next, thin lines of the conductive material are removed by laser machining methods in a pattern which leaves coils as bands of conductive material located radially around the core. Each turn or band was connected to the next turn by a suitable indexing.

U.S. Pat. No. 6,300,857 for "Insulating Toroid Cores and Windings" discloses a configuration to improve the winding of precise conventional transformer coils and includes an insulating jacket around a magnetic core. The insulating jacket includes plural protrusions around the core, the protrusions demarking various segments of the toroid. For example, the toroid may be divided into six evenly spaced sections, each occupying approximately 60°. At the edges of each section, there is a protrusion. The protrusions maintain the placement and spacing of windings within each section.

An object of the present invention is to provide a precision Rogowski coil with its winding geometry defined and controlled at the time of manufacture, with improved dimensional stability maintained throughout its lifetime.

SUMMARY OF THE INVENTION

A precision Rogowski coil according to certain aspects of the present invention includes a generally toroidal (or toroid-like) core having grooving thereon in which to register the wire (or other conductive material) turns of a main coil. Illustratively the core is made of a moldable material having grooves therein in a pattern corresponding to the main coil winding. Preferably the grooves are helical, and the coil wire or conductor fits into the grooves on the core. A conductor other than wire can be used, such as a deposited conductor. A return path or reverse winding are also provided, and various structures and methods address return path cancellation and thermal and other variations.

Invented manufacturing techniques include molding a core having grooving on its exterior and then winding wire in the grooving or otherwise forming a conductive winding using the grooving to control the location of the winding on the core.

BRIEF DESCRIPTION OF THE DRAWINGS

In describing preferred embodiments of the present invention, reference is made to accompanying drawings wherein like parts bear similar reference numerals and wherein:

FIG. 1A is a diagram of a top view of a toroidal coil core, prior to winding wire thereon, with some of the grooving shown, and embodying various aspects of the present invention;

FIG. 1B is a diagrammatic side view of the core of FIG. 1A, and showing a circumferential wire loop wound thereon for return path cancellation;

FIGS. 2A and 2B are sketches of two alternate constructions of the core with representative constant pitch helical winding wound thereon using a circumferential loop for return path cancellation;

DESCRIPTION OF PREFERRED EMBODIMENTS

Figure 2B:
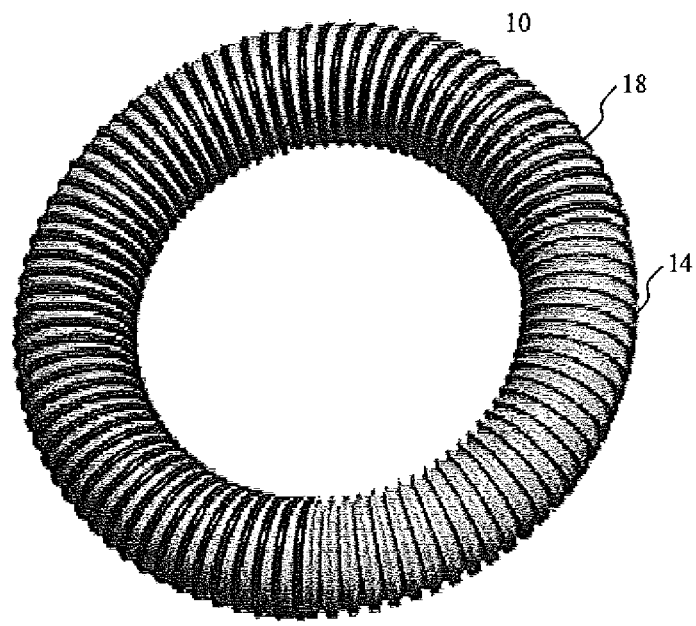

FIG. 1A illustrates a core 10 shaped generally as a toroid. The term "toroid" often connotes a "doughnut" shape but the present invention does not require a "doughnut" shape for the core 10. It will be understood from the illustrative drawings and the present description that a cross section cut through a diameter or radius of core 10 can be either circular, substantially rectangular, or otherwise, e.g. oval, oblong, or some other shape. That is, core 10 may have the geometric shape of a solid formed by rotating (orbiting) a closed form, be it a circle, square, rectangle, oval, oblong, or irregular shaped closed line, around 360 degrees of a circle. Thus, FIG. 2A shows a Rogowski coil according to certain aspects of the present invention where the core has generally "flattened" faces (like an annulus), which (but for the grooving) could be formed geometrically by rotating a rectangle with rounded corners around 360 degrees of a circle. FIG. 2B on the other hand shows another core according to aspects of the present invention, where the faces are not flattened but instead are rounded with a circular cross section (somewhat like an O-ring). That geometric form (again, without the grooving) could be obtained by rotating a circle around 360 degrees of a larger circle. Hence, the term "toroid" as used herein is used in a broad context and is intended to embrace all such geometries.

The wires for a precision Rogowski coil will be wound on core 10. Core 10 may vary widely in dimensions, illustratively on the order of 0.25 inch in outside diameter (or less) to eighteen or twenty inches, or more. Preferably core 10 comprises a non ferro-magnetic, electrical insulator, preferably one with a minimal coefficient of thermal expansion, and more preferably a moldable polymeric material. Illustratively, core 10 may be made of Thermoset Polyester with thermal expansion coefficient in the order of 9 ppm/° C., glass reinforced thermoplastic polyester PET (36 ppm/° C.), glass reinforced epoxy (36 ppm/° C.) or ABS/polycarbonate (67 ppm/° C.). It is understood that other materials can be used to achieve a specific cost/performance target without diverging from the spirit of this invention.

Core 10 is patterned with precision grooves 12 around its exterior. Although FIG. 1A illustrates the patterning in a small continuous section, it is to be understood that the patterning extends, in the preferred embodiment, around the full 360° ($2\pi$ radians) as shown in FIGS. 2A, 2B, 4A, 4B, 5, 6 and 8. In the first embodiment, groove 12 is a single, continuous helical groove as shown in FIG. 2B. The groove pattern may be molded with uniform, predetermined characteristics so that each core 10 made from the mold has precisely the same shape and the same precision grooving. Alternatively, groove 12 could be placed on the core by a machine process. It is convenient to refer to this pattern as "grooving," a "groove," or "grooves" since the singular or plural can be used to describe this feature which may comprise, as indicated, a substantially continuous groove that wraps about the toroid in a clockwise or counterclockwise direction. Hence, when viewed from a plan view, as in FIG. 1A, one sees what appears to comprise a plurality of grooves which indeed (in one embodiment) comprise a single groove having multiple turns, thereby appearing to comprise plural grooves.

Preferably grooving 12 has a uniform pitch around the toroid. Preferably the dimensions of grooving (i.e., its width and depth) correspond in size to magnet wire to be used for wrapping around the core. The magnet wire used for the coil and return path conductor can be wound on the toroidal core in well-known fashion using well-known equipment for this task. The coil may comprise a large number of turns, illustratively 1000 turns, although no upper or lower limitation in the number of turns is implied. During the winding process, the wire of the main coil seats in the grooves 12. That is, with respect to FIG. 1A, wire may be wound around the toroid so that it "enters the page" on the outside of the core 10 and "comes out of the page" in the central opening of the toroid, or vice versa. By using this grooving, the coil geometry is defined and controlled at the outset, and the resulting Rogowski coil will be dimensionally stable throughout its lifetime. Following winding of magnet wire, a varnish based coating can be added to further stabilize the coil.

Return path cancellation can be achieved in various ways. One way is to provide a return loop. Illustratively, a circumferential groove 14 may be machined, molded, or otherwise provided around the outside edge of core 10, as seen in FIG. 1B. A return loop 16 can be positioned in such groove 14. The return path (return loop 16) is to null out, to the extent possible, the effect of the coil wound about the toroid. Thus, if the coil advances around the toroid in a clockwise direction, then return loop 16 must be wound in the counterclockwise direction, or vice versa. Typically, the return loop is wound around the circumference first, and then the coil is wound over toroid on which the return path conductor is already in place. This is a first technique for return path cancellation.

Figure 3:
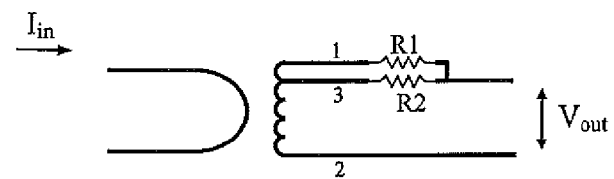
FIG. 3 is an electrical circuit diagram of a resistive network applicable to Rogowski coils of the present invention for effective return path diameter (radius) compensation.

Turning now to FIGS. 2A, 2B, and 3, to make the Rogowski coil more precise, the cancellation of the return path conductor may be improved by the addition of a resistive network. FIG. 2A is a view of a Rogowski coil, which comprises main wire turns 18 and the return loop 16. Electrically, the coil has points 1, 2, and 3. Point 1 is the end of the return loop 16. Point 2 is the beginning of the main coil 18. Point 3 represents the point at which the main coil 18 connects to the return loop 16.

The main coil 18 will have an effective advancement path radius represented by r1 in FIG. 1A. As visible from FIG. 1A, for a uniformly wound helical coil, effective advancement path $r_1$ will be positioned within the coil, half way between the inner radius $r_i$ and the outer radius $r_o$ of the coil. A similar situation occurs depth-wise, thus making the effective advancement path effectively positioned in the center of the core 10 used to support the winding. Return loop 16 is located generally at the outer edge of the core 10, except it sits within groove 14 so that its actual radius is slightly less than the maximum radius of the toroid. In FIG. 1A, r2 denotes the actual radius of the return loop 16. The return loop radius r2 is generally larger than effective radius r1 with the result that return path cancellation is suboptimal. Other parameters, namely the z-axis position and concentricity of the two paths ("front" and "back" of the toroid) are well matched, making it possible to use a passive circuit based technique for return path effective diameter (radius) adjustment.

An effective diameter adjustment technique is shown in FIG. 3. The basic mathematical relationship between individual coil outputs for a magnetic field parallel to the axis of the toroid is given in Equation 1 below, where the notation $V_{Desired}$ is used to indicate the coil output resulting from the main coil advancement path governed by the effective radius $r_1$. Since radius $r_2$ is different than $r_1$, the return path compensation coil output $V_{Actual}$ will in general be different, and the ratio between the voltages will be proportional to the ratio of the squares of the two radii. By advantageously positioning the return coil on the outside of the effective advancement path radius $r_1$ of the main coil ($r_2 > r_1$), it is possible to ensure that $V_{Actual} > V_{Desired}$ making it possible to use a simple resistive divider (highly reliable passive network) to match exactly the desired compensation path output to the actual output of the coil advancement path. The resistive divider is used to effectively reduce radius $r_2$ with the objective of matching it to the radius $r_1$.

$$\frac{V_{Desired}}{V_{Actual}} = \frac{r_1^2}{r_2^2} \quad (1)$$

$$V_{Desired} = \frac{V_{Actual} \times R_2}{R_1 + R_2} \quad (2)$$

$$R_1 = \frac{(r_2^2 - r_1^2)}{r_1^2} \times R_2 \quad (3)$$

Equation (2) above describes the matched state relationship. Simple algebraic manipulations allow equations (1) and (2) to be used to determine the ratiometric relation between gain matching resistors R1 and R2. The final relation is given in equation (3). It will be understood that by changing the coil geometry (thus affecting the effective radii $r_1$ and $r_2$ by making $r_1 > r_2$), it may become necessary to attenuate the output of the main coil instead of the return path output. Such modification is anticipated and does not deviate from the spirit of this invention.

The exact value of matching resistors is less significant than their ratio, with typical values ranging between 1 and 1000 ohms. If advantageous, the resistor value can be selected to match the attached transmission line impedance. The resistor value should be kept below 1000 ohms to reduce the resistor-generated noise contribution. The resistive network can be placed in close proximity of the coil, by soldering resistors R1 and R2 directly to the return (compensation) coil output. If required, a separate set of conductors can be used to bring both the output of the main coil and the return coil to a remote location (up to 100 m) equipped with resistors R1 and R2.

Figure 4A:
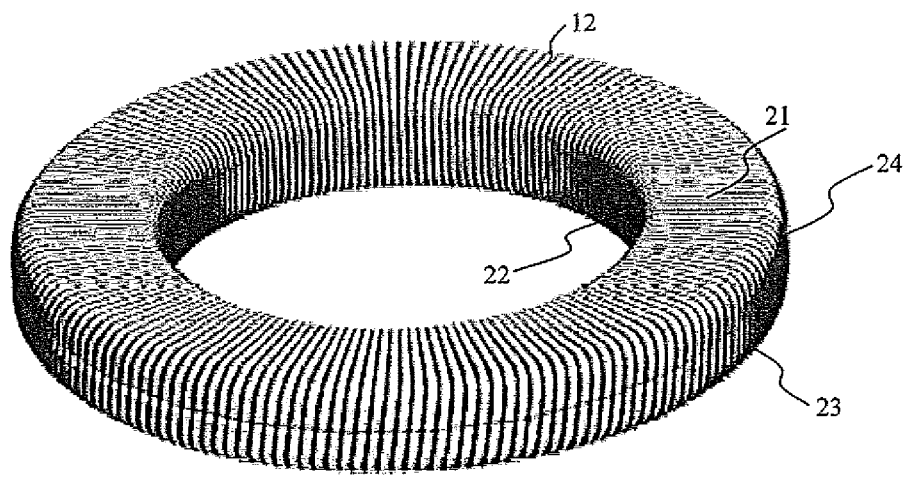
FIGS. 4A and 4B represent another embodiment of a toroidal core with modified grooving, forming a Rogowski coil having a winding that is radial on three sides of the toroid with coil advancement restricted to the forth (outer) side.
Figure 4B:
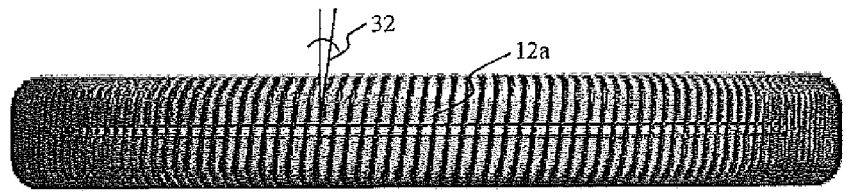

Referring to FIG. 4A, and 4B, a modification of this first approach for cancellation is to provide essentially radial grooves 12 at first locations 21 (upper face), 22 (inside face), and 23 (lower face) of the toroid, and to provide sequential non-radial grooving 12a (see FIG. 4B) at second locations 24 radially outward of the radial grooving, thereby to concentrate the coil advancement at the second locations 24. It will be appreciated that in FIGS. 4A and 4B, the second locations 24 are located toward or on the outside edge of the toroid core 10. As will be appreciated, the grooves 12a are not radial, but are pitched 32, and remain symmetrical. They include a radial component located closer to the center of the toroid and a non-radial component 32 located outward, close to the outer edge of the toroid as shown in FIG. 4B. By concentrating all of the coil advancement on the outside edge the advancement path, radius r1 is increased and can be brought very close to the return loop radius r2, thus alleviating (and in less demanding applications, totally eliminating) the need for resistor based compensation.

Figure 8:
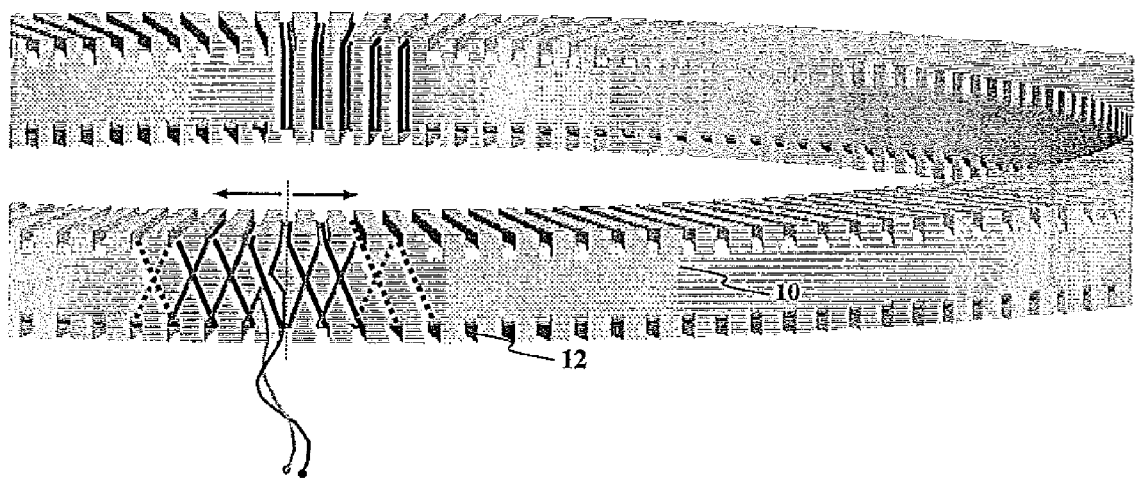
FIG. 8 represents another embodiment of the current invention in which the grooves are used to support a second coil wound on top of the first coil, but with an opposite direction of coil advancement.

A third technique for return path cancellation is to provide, instead of the single loop 16 in groove 14, a second layer of winding, that is, a return winding, with a constant pitch adjusted to avoid physical interference between the two layers. The pitch of the second winding layer need not match the winding pitch of the first layer and can conveniently be reduced to as little as ten turns, illustratively. Further reduction lower than ten turns is counterproductive due to the potential for increased sensitivity to the measured conductor position. Thus, after winding a first coil using the grooving 12 as a guide to register the wire turns, a return winding is made on top or next to the first one, but in the opposite direction of coil advancement. One embodiment of this invention is shown in FIG. 8. The windings are assumed to cover the entire circumference of the toroid, as indicated by the arrows in the figure.

Through use of the patterned thermoplastic, a high quality coil can be manufactured economically and still be essentially insensitive to external influences, insensitive to measured primary conductor position, and will retain high precision on the order of 0.3% over its lifetime across a wide operating temperature range, illustratively from −40° C. to 70° C. It will be understood, furthermore, that the core need not be thermoplastic material but can be an insulator manufactured according to any known technology such as molding, machining, and other forms of manufacturing well known in that art.

Nevertheless, if there are effects of temperature, temperature and gain compensation techniques are applicable to the precision wound toroid according to the present invention. Return path cancellation as set forth above is used to compensate for the effect of coil advancement. An actual Rogowski coil implementation will exhibit additional sources of error. The most pronounced additional errors are: (1) temperature dependence of the coil output; (2) individual coil gain differences caused by the manufacturing process variations; and (3) capacitive coupling based errors from neighboring high voltage conductors.

Temperature dependence is present if the material used to form the core for the Rogowski coil changes physical dimensions (expands and contracts) with temperature variations. It is very common for materials to expand with increasing temperature, causing in turn an increase of the Rogowski cross sectional area. Since the Rogowski coil output is a direct function of the cross sectional area, as given in Equation (4) below, it will increase as the material used to support the coil expands.

$$V_{(t)} = \mu_0 S \frac{di}{dt} \quad (4)$$

where: $\mu_0$=permeability of free space ($4\pi*10^{-7}$ Vs/Am)
S=total cross sectional area of the coil
i=measured primary current
t=time Careful selection of core material is used to minimize the thermal expansion coefficient, thus significantly reducing the temperature dependency of the coil gain. Preferred core materials have been mentioned above. While dimensionally stable materials (with a coefficient of thermal expansion ("CTE")<5 ppm/° C.) are available, material cost increases with tighter CTE specifications. If the coil is to be formed on a material with a non-zero or negligible CTE, it will be desirable to provide localized compensation for temperature effects.

Figure 7:
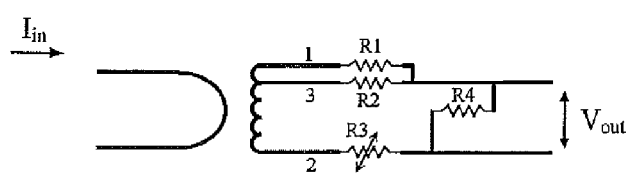
FIG. 7 is an electrical circuit diagram of a resistive network applicable to Rogowski coils of the present invention for temperature and gain compensation.

Referring to FIG. 7, such compensation can be achieved by adding a thermally sensitive compensation resistor (R3) and combining it with a temperature stable resistor (R4). When combined, resistors R3 and R4 form a temperature compensating divider, which is added to the main coil output. By carefully adjusting individual value of the resistors R3 and/or R4 it is also possible to compensate for the individual gain variation among multiple coils. Gain compensation is normally performed during coil manufacturing (factory calibration) by trimming one or both legs of the output divider. Individual coil gain is determined by passing known electrical current through the coil opening, and recording the voltage present at the coil output, or by comparing the coil output with a known calibration artifact.

It will be appreciated that grooves 12 need not extend in a single helical pattern around core 10. In the event that, for example, one desired to segment the coil, the grooves 12 could be segmented as desired, illustratively providing left and right segments each occupying substantially 180° of arc, or three segments each having substantially 120° of arc, or four segments having 90° of arc each, and so forth.

It is preferred that the grooves 12 extend substantially continuously around the toroidal core 10 in helical fashion. One discontinuity already occurs where groove 12 intercepts the circumferential groove 14. However, further discontinuities could be allowed, with groove being essentially reduced to simple notches positioned at the four edges of the toroid. Thus, while grooving may extend around 360° of arc of the coil (in the plane represented in FIG. 1), a variation may truncate the grooving.

Figure 5:
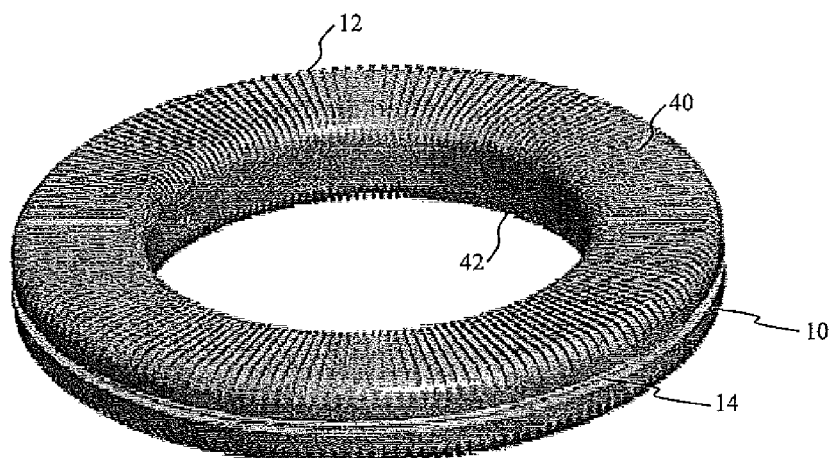
FIG. 5 represents an alternate construction of a toroidal core embodying aspects of the present invention.

FIG. 5 shows one such variation wherein grooves 12 are discontinuous but nevertheless aligned in the helical or other patterns described herein. Grooves 12 may, illustratively, comprise first portions 40 located on the face of the toroid, second portions located around an outside perimeter (not shown in FIG. 5), third portions located around an inside perimeter (not shown in FIG. 5), and fourth portions 42 located on the opposite face of the toroidal coil 10.

Figure 6:
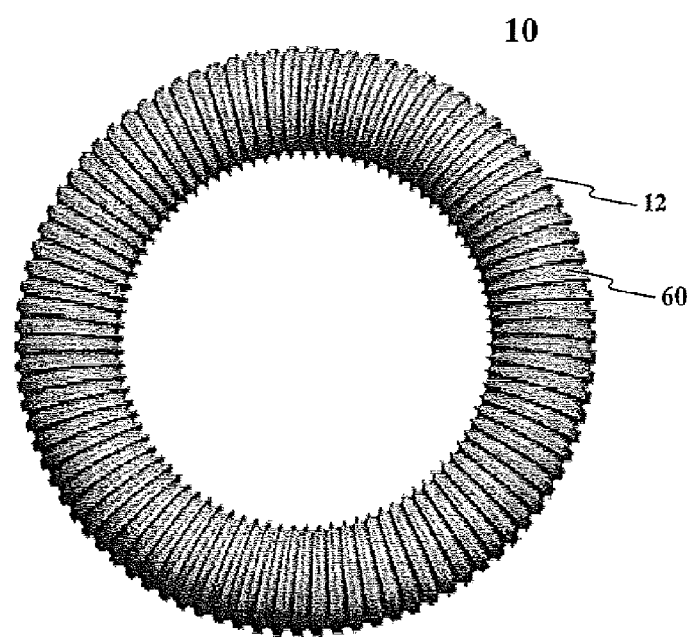
FIG. 6 is used in describing an alternate coil manufacturing method in which the grooved toroidal core is used as a substrate for conductive material being deposited within the grooves.

In yet another aspect of the invention, the main coil can be manufactured by using conductive material deposited into the grooves of the toroid. This approach requires three steps: manufacturing of the grooved toroid, application of the conductive layer covering the entire surface of the toroid, and removal of the conductive material from the elevated ridges, thus forming the coil by leaving only the conductive material within the grooves. This approach is illustrated in FIG. 6 wherein the entire surface of the grooved toroid 10 is made conductive using electrochemical deposition (electroplating), vacuum deposition, or by extruding conductive polymer into the grooves 12. The coil is formed by subsequently machining (sanding, grinding) the outside surfaces of the toroid, thus forming the insulated ridges 60 in between the individual loops of the main coil 12. The return coil is realized in accordance with the previous descriptions and is not shown in FIG. 6.

While above disclosures describe Rogowski coil geometry realized on a grooved toroidal core, it is to be understood that basic toroid geometry may be substituted with an ellipse, rounded corner parallelogram or other shape necessary to meet specific application requirements.

It will be evident that other modifications or variations can be made within the scope and spirit of the present invention. While the invention has been described in conjunction with specific illustrative embodiments, those embodiments are not intended to limit the scope of the present invention, the scope of which is set forth in the accompanying claims which are intended to embrace alternatives, modifications, and variations which fall within the spirit and scope of the invention.

The invention claimed is:

1. A coil comprising:
   a generally toroidally-shaped core;
   grooving on the exterior surface of said core; and
   a conductive coil extending about said core, said conductive coil being registered in said grooving the coil constituting a main coil;
   a return loop wrapped generally circumferentially about the core; and,
   a resistive network electrically coupled to the return loop and the main coil.

2. The coil of claim 1, said return loop wrapped on top of said main coil in a reverse direction of advancement as said main coil.

3. A coil comprising:
   a generally toroidally-shaped core comprising a non-magnetic insulating material;
   grooving on the exterior surface of said core, at least a portion of said grooving being helical, said grooving being configured to receive wire; and
   a wire coil wound in a helical configuration about said core and registered in said grooving advancing in a first direction, the coil constituting a main coil;
   a return loop wrapped generally circumferentially about said core and advancing in a second direction; and,
   a resistive network electrically coupled to the return loop and the main coil.

4. The coil of claim 3, said return loop wrapped on top of said main coil in a reverse direction of advancement as said main coil.

5. A coil according to claim 1 wherein said resistive network compensates for differing radii as between a return path and said coil effective advancement path radius.

6. The coil according to claim 1 wherein said resistive network compensates for thermal effects on the coil.

* * * * *